(12) United States Patent
Thiagarajan et al.

(10) Patent No.: US 12,261,602 B2
(45) Date of Patent: Mar. 25, 2025

(54) ULTRA-LOW POWER ADAPTIVELY RECONFIGURABLE SYSTEM

(71) Applicant: Cypress Semiconductor Corporation, San Jose, CA (US)

(72) Inventors: Eashwar Thiagarajan, Bothell, WA (US); Andrew Page, Kirkland, WA (US); Harold Kutz, Edmonds, WA (US); Kendall Castor-Perry, Seattle, WA (US); Rajiv Singh, Bothell, WA (US); Erhan Hancioglu, Shoreline, WA (US); Bert Sullam, Bellevue, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 122 days.

(21) Appl. No.: 18/082,900

(22) Filed: Dec. 16, 2022

(65) Prior Publication Data

US 2023/0188139 A1    Jun. 15, 2023

Related U.S. Application Data

(63) Continuation of application No. 16/369,723, filed on Mar. 29, 2019, now Pat. No. 11,533,055.
(Continued)

(51) Int. Cl.
*H03K 19/173* (2006.01)
*G06F 13/28* (2006.01)
(Continued)

(52) U.S. Cl.
CPC ......... *H03K 19/1736* (2013.01); *G06F 13/28* (2013.01); *H03F 3/189* (2013.01); *H03F 3/72* (2013.01); *H03M 1/1245* (2013.01)

(58) Field of Classification Search
CPC ....... H06K 19/1736; H03F 3/189; H03F 3/72; H03M 1/1245; G06F 13/28
See application file for complete search history.

(56) References Cited

U.S. PATENT DOCUMENTS 6,894,632 B1    5/2005   Robinson
9,514,066 B1    12/2016  Diaz et al.
(Continued)

FOREIGN PATENT DOCUMENTS

CN    10393 1134 A    7/2014
CN    104917529 A     9/2015
(Continued)

OTHER PUBLICATIONS

Japanese Office Action from Application 2021-512623 dated May 10, 2023; 3 pages.
(Continued)

*Primary Examiner* — Jaweed A Abbaszadeh
*Assistant Examiner* — Hyun Soo Kim

(57) ABSTRACT

Implementations disclosed describe an integrated circuit (IC) having a plurality of reconfigurable analog circuits that include a finite state machine (FSM) logic circuit and further include an interface to receive an input signal. In a first IC configuration, with the plurality of reconfigurable analog circuits having a first configuration setting, the IC may process the input signal through the plurality of reconfigurable analog circuits to generate a first output value based on the input signal. Responsive to the FSM logic circuit processing the first output value, the IC may reconfigure the plurality of reconfigurable analog circuits into a second IC configuration having a second configuration setting.

19 Claims, 8 Drawing Sheets

Related U.S. Application Data

(60) Provisional application No. 62/770,382, filed on Nov. 21, 2018, provisional application No. 62/728,290, filed on Sep. 7, 2018.

(51) Int. Cl.
*H03F 3/189* (2006.01)
*H03F 3/72* (2006.01)
*H03M 1/12* (2006.01)

(56) References Cited

U.S. PATENT DOCUMENTS

| | | | |
|---|---|---|---|
| 2002/0067303 A1 | 6/2002 | Lee et al. | |
| 2002/0108006 A1 | 8/2002 | Snyder | |
| 2007/0241780 A1 | 10/2007 | Teig et al. | |
| 2008/0076364 A1* | 3/2008 | Hall | H04W 52/0229 455/260 |
| 2008/0218602 A1 | 9/2008 | Kozlowski | |
| 2009/0249154 A1* | 10/2009 | Sasaki | H04L 1/1829 714/E11.131 |
| 2011/0077865 A1* | 3/2011 | Chen | G01P 1/127 702/3 |
| 2011/0283057 A1 | 11/2011 | Snyder | |
| 2013/0063349 A1 | 3/2013 | Rankin | |
| 2014/0032880 A1* | 1/2014 | Ka | G06F 1/325 712/30 |
| 2014/0095757 A1* | 4/2014 | Snyder | G06F 1/32 710/305 |
| 2014/0316867 A1* | 10/2014 | Rosen | G06F 16/95 705/14.6 |
| 2016/0065216 A1* | 3/2016 | Thiagarajan | H03K 19/0005 326/38 |
| 2016/0087644 A1 | 3/2016 | Field | |
| 2016/0187961 A1* | 6/2016 | Elibol | G06F 13/4022 345/173 |
| 2016/0295619 A1 | 10/2016 | Koroku | |
| 2016/0329900 A1 | 11/2016 | Thiagarajan et al. | |
| 2017/0255252 A1* | 9/2017 | Kulathumani | G06F 1/32 |
| 2017/0364139 A1* | 12/2017 | Dalal | G06F 1/3209 |
| 2019/0246172 A1* | 8/2019 | Cheong | G06F 3/01 |
| 2021/0344881 A1* | 11/2021 | Wu | G08B 13/19669 |

FOREIGN PATENT DOCUMENTS

| | | |
|---|---|---|
| CN | 105389273 A | 3/2016 |
| CN | 105450229 A | 3/2016 |
| CN | 107026648 A | 8/2017 |
| CN | 107077580 A | 8/2017 |

OTHER PUBLICATIONS

Chinese Patent Office Action from Application 201980057759.4 dated Oct. 26, 2023; 25 pages.
Chinese Notice of Allowance from Application 201980057759.4 dated May 17, 2024; 4 pages.

* cited by examiner

ULTRA-LOW POWER ADAPTIVELY RECONFIGURABLE SYSTEM

RELATED APPLICATIONS

This application is a Continuation Application of U.S. patent application Ser. No. 16/369,723, filed Mar. 29, 2019, which claims the benefit of U.S. Provisional Application No. 62/728,290, filed Sep. 7, 2018, and U.S. Provisional Application No. 62/770,382, filed Nov. 21, 2018, all of which are incorporated by reference herein in their entirety.

TECHNICAL FIELD

The present disclosure pertains to integrated circuit (IC) devices having programmable analog blocks; more specifically, to optimizing performance and power management of IC devices by reconfiguring the programmable analog blocks in response to changing conditions.

BACKGROUND

Integrated circuit devices can include both analog and digital blocks. Analog blocks are often made reconfigurable in order to meet demands for multitask processing and to facilitate optimal power management. Analog blocks are capable of delivering functionality, such as making measurements and performing comparison of measured quantities, which digital blocks cannot provide. In a combination, analog and digital blocks can combine flexibility of software instructions executed by digital blocks with the speed of analog hardware. While digital blocks are better at handling more computation-heavy tasks, analog blocks can deliver superior performance where speed and saving energy are critical. Accordingly, careful allocation of execution of various tasks between analog and digital blocks is important in order to optimize speed, complexity, and energy efficiency of processing. This is especially crucial where integrated circuits are used in medical electronic devices, internet of things device, and various portable electronic devices that have limited energy resources and where benefits of effective power management can be particularly significant.

DETAILED DESCRIPTION

Figure 1:
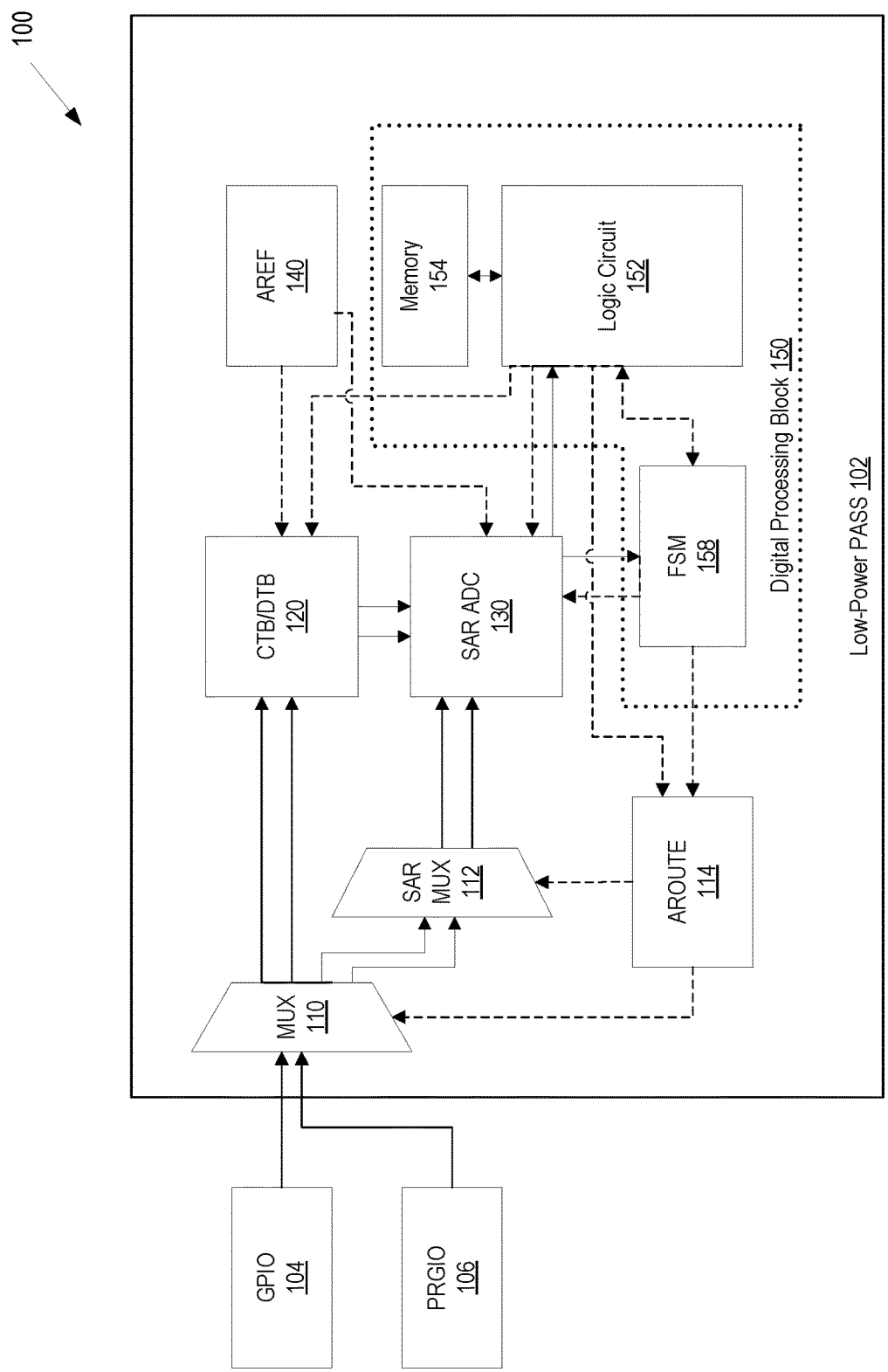
FIG. 1 is a block diagram of one exemplary implementation of a reconfigurable low-power programmable analog subsystem.

Aspects and implementations of the present disclosure are directed at optimizing performance and power management of integrated circuit (IC) devices by utilizing autonomous reconfigurability of the analog circuits independent of the digital processor which may remain in a sleep mode or perform a different operation. The processor may be located in the same die/substrate as the analog circuits, or may be implemented separately. The analog circuits may be combined into a programmable analog subsystem (PASS) that may be used in combination with or, in some implementations, separately from a digital subsystem that may comprise a central processing unit (CPU) and a memory device. In some implementations, the digital subsystem may be a large-scale computing device, a general purpose processing unit (GPU), or an application processing unit (APU). In other implementations, the digital subsystem may be a microcontroller unit (MCU) having a CPU and memory and designed to govern a specific operation. The microcontroller unit may be a separate circuit or a circuit embedded into a larger system. The PASS may use a logic circuit (in some implementations, in conjunction with one or more finite state machines) for decision-making regarding reconfiguring one or more analog devices, such as input-output (IO) devices, routing devices, continuous time blocks (CTB), Discrete-Time Blocks, analog-to-digital converters (ADC). For example, upon receiving and processing an input signal into one or more output data, the PASS may reconfigure one or more of its programmable analog circuits responsive to the output data. The PASS may perform such reconfiguration without waking up the CPU, if the CPU is in a sleep state, or without requesting the CPU instructions, if the CPU is in an active state. The PASS may continue to receive and process the input signals and be on the lookout for further output data. Responsive to such further output data, the PASS may communicate a wake-up instruction to the CPU. The CPU may perform processing and, in some implementations, may output configuration data to the PASS with additional instructions for how to reconfigure one or more of the PASS analog circuits.

Modern computing devices, especially automotive, wearable, hand-held, metering, appliance-integrated, and the like, require increasingly efficient power management. Many portable devices cram significant computational resources into a small form factors. Compact dimensions may limit capacity of portable devices for energy storage. Accordingly, it becomes increasingly crucial to optimize energy consumption during execution of a various tasks. Generally, executing a task faster by a minimal number of essential components leads to better utilization of energy resources. An IC may consist of a digital subsystem (e.g., a microcontroller unit) having a CPU and a reconfigurable analog subsystem. The digital subsystem may remain in a low-power sleep mode while the analog subsystem may be in a mode with limited functionality. The analog subsystem may receive an input signal (e.g., a voice signal) through its front end module and provide the signal, after analog processing (e.g., decoding, filtering and amplification) to an analog-to-digital converter, and then for digital pre-processing. The digital pre-processing output may indicate that the input signal meets a certain threshold criteria or otherwise indicates an event. Responsive to such determination, the analog subsystem may communicate a wake-up instruction to the CPU. Subsequently, the CPU may execute instructions stored in the memory of the digital subsystem and reconfigure the parameters of the analog subsystem so that the analog circuits may provide functionality that is better adjusted to the changed conditions.

For example, the analog subsystem may monitor input signals for an occurrence of one or more conditions, such as a drop of the ambient temperature below a certain pre-set minimum. Upon such an event, the analog blocks may wake up the CPU, which, upon execution of software or firmware, can turn on or adjust a heating system. Additionally, the CPU can reconfigure the analog blocks. After the heating system is turned on, the analog blocks can be reconfigured to monitor for a temperature rise above some pre-set maximum. The CPU and/or other digital blocks can then return to the low-power sleep mode while the reconfigured analog blocks can further monitor the ambient temperature. When the maximum temperature is achieved, the analog blocks can trigger another processor wake-up for further digital processing (e.g., control of the heating system) and/or analog block reconfiguration. As a result, the power consumption can be greatly reduced.

Such an approach, however, has a number of shortcomings. It relies on the CPU functionality (processing power and instruction execution) for the reconfiguration of the programmable analog circuits. But the CPU can consume a significant energy even while executing a minimal reconfiguration of the analog subsystem. Moreover, the CPU can take a considerable time to wake up from a sleep mode to an active state, so that the power economy in the sleep mode may come at a price of a delayed performance. Such a lack of reconfigurability of the analog circuits while the CPU remains in the sleep mode can, therefore, be a disadvantage where power management and processing speed are essential. In particular, in a situation where the CPU may be called upon to respond to multiple false alarms, utilization of computing resources can become suboptimal. This problem is further exacerbated when various analog blocks have fixed functionality (such as resolution or a range of parameters of monitoring) and can only be reconfigured with CPU involvement. As a result, in dynamic environments, when typical time intervals between monitored events or conditions become shorter than the times required for CPU wake-up and data processing, integrated circuits with CPU-only reconfigurable analog blocks become incapable of efficient power management.

Aspects and implementations of the present disclosure address this and other deficiencies of the existing ICs by providing dynamic configurability of programmable analog circuits without active CPU involvement or input. Various analog circuits may be combined into a low-power (LP) programmable analog subsystem (PASS) which may be capable of being in one of a plurality of states selectable in response to one or more received input signals or external conditions without CPU input. For example, the LP PASS may reconfigure itself into a different configuration while the CPU remains in a sleep state. In some implementations, the CPU may be in an active state, but the LP PASS may perform a reconfiguration without requesting CPU instructions. This may allow the CPU to perform other functions, such as processing of digital tasks that may be related or unrelated to the tasks that the LP PASS is performing. This may allow to process the same task faster, if both the LP PASS and the CPU are processing different parts of the same task, or it may allow concurrent processing of different tasks by the LP PASS and the CPU.

Selection of the state of the LP PASS may be accomplished by a logic circuit receiving a digital signal from an analog-to-digital converter (ADC) circuit or from a comparator. The ADC circuit may receive one or more analog signals pre-processed by front-end analog circuits. The input signals received by the LP PASS may represent a variety of external conditions. In some implementations, the input signals may be radio waves, light signals, sound waves, indicators of motion, direction, speed, temperature, mechanical contact, chemical compositions or any other signals that may be generated by environmental sensors representative of the state of physical or chemical environment surrounding the LP PASS. In some implementations, sensors may detect environments located at significant distances from the LP PASS.

FIG. 1 is a block diagram of one exemplary implementation 100 of a reconfigurable LP PASS. The LP PASS 102 may be connected to one or more input-output (IO) devices to receive input signals from one or more signal sources. The IO devices may include one or more general purpose input output device (GPIO) ports 104 or programmable input output (PRGIO) blocks 106, which may comprise a plurality of pins, switches, or sensors capable of delivering to the LP PASS 102 input signals as described above. In some implementations, the IO devices may include a radio frequency (RF) front end for radio processing supporting a wireless area network, a personal area network, or a software-defined radio system. The RF front end may be capable of receiving, transmitting, and/or processing RF (or intermediate frequency) signals including amplification, decoding, and/or other traditional components of radio signal processing. In some implementations, various IO devices (e.g., temperature sensors) may be mounted on the same chip (e.g., same Si substrate) as the LP PASS 102. In other implementation, some or all of the IO devices may be external to the LP PASS 102 but communicatively coupled to it.

The signals input through the IO devices may be routed to various analog blocks via a plurality of multiplexers (MUX). FIG. 1 shows an exemplary system with two MUXs 110 and 112. Additional MUXs may be present in other implementations to rout input data from a plurality of the IO devices to various circuits in the LP PASS. The processing paths for the input signals are shown on FIG. 1 as solid lines, with the arrows indicating the direction of signal propagation. In some implementations, some of the input signals may be routed to a continuous time block (CTB) 120 for continuous time domain processing. In CTB 120 various input signals may be decoded, amplified, converted (e.g., from current to voltage signals, or from current to time signals, or from voltage to time signals, or from voltage to frequency signals, and so on) compared, buffered, or similarly processed. In some implementations, a discrete time block (DTB), for signal processing at discrete times, may be used in place of a CTB or in addition to a CTB. The CTB/DTB 120 outputs may be input into an ADC, such as a successive approximation register (SAR) ADC 130, in one exemplary implementation. The SAR ADC 130 may transform the input analog signals into digital signals. The system of multiplexers may route some input signals directly to the SAR ADC 130 bypassing the CTB/DTB 120. For example, in some implementations, a dedicated SAR MUX 112 may be used to route input signals that are intended to be provided directly to the SAR ADC 130. An analog routing block (AROUTE) 114 may provide control data (such as configuration of switches) for some or all of the MUXs of the LP PASS 102. The AROUTE 114 may provide signal routing data to facilitate connectivity between the IO devices and a plurality of analog blocks, such as the CTB/DTB 120 and the SAR ADC 130. Different configurations of the LP PASS 102 may have different routing fabrics. For example, in some configurations intended for rough speech detection, a sound input signal from a microphone input may be delivered through SAR MUX 112 directly to SAR ADC 130. In other configurations, in contrast, when more accurate speech recognition is intended, the sound input from a microphone may be first routed to the CTB/DTB 120 for continuous or discrete time processing. As a further example, in an instance of smoke detection, the routing fabric may direct input signals to SAR ADC 130 but once the presence of smoke has been established, the LP PASS 102 may be reconfigured into a different configuration with the input signals routed through the CTB/DTB 120 for additional processing intended to determine smoke composition. By providing control signals to the MUXs, the AROUTE 114 may facilitate such input signal rerouting. In some implementations, the LP PASS 102 may include one or more buses. In some implementations, the LP PASS may include a fabric of buses. In some implementations, routing via buses may be controlled by the AROUTE 114 providing control signals to the MUXs 110 and 112. In some implementations, some of the buses may provide direct signal routing to various blocks of the LP PASS 102 the MUXs 110 and 112.

The SAR ADC 130 may convert one or more signals (e.g., continuous-time signals) into one or more digital signals. The SAR ADC 130 may use a binary search with a resolution that may depend on the specific configuration of the LP PASS 102. For example, in the default configuration of the LP PASS, for detection of some quantity A, the SAR ADC 130 may be configured to output just a single bit with the values 0 or 1 corresponding to the quantity A being below or above a certain pre-determined threshold value. Once the quantity A has been above the threshold value for a certain amount of time (e.g., cumulatively for more than 5 of the last 10 sec), the SAR ADC 130 may be reconfigured into a state where the output value is specified with two bits (e.g., states 00, 01, 10, 11), three bits (001, 101, etc.), or more, depending on the required resolution.

The functionality of the analog circuits (such as MUXs, CTB, SAR ADC) may be supported by an analog reference block (AREF) 140, in some implementations. AREF 140 may provide reference voltages and reference currents to other analog blocks. For example, AREF 140 may provide bandgap voltage, low voltage, high voltage, and the like. In some non-limiting example, the low voltage may be 1.1 V while the high voltage may be within the range 2.7-5.5 V, or any other value. AREF 140 may similarly provide reference currents to various analog blocks. In some implementations, reference voltages and reference currents may be specific to the analog block to which they are provided. In some implementations, reference voltages and reference currents may be temperature-independent. In some implementations, reference voltages and reference currents may be proportional to temperature or may have some other pre-determined temperature dependence. In some implementations, AREF 140 may have a repeater capability, so that multiples of the reference voltages (and/or currents) may be provided to various analog circuits. AREF 140 may further provide clock signals for various analog circuits. In some implementations, AREF 140 may provide different clock signals to different analog circuits.

The signals processed by the analog blocks (and circuits within those blocks) may be input into a digital processing block 150 of the LP PASS 102. For example, as illustrated by a solid line in FIG. 1, a digital signal may be delivered from SAR ADC 130 to a logic circuit 152 of the digital processing block 150. The logic circuit 152 may include a plurality of interconnected logic gates. The logic circuit 152 may be capable of executing instructions stored in a memory device 154, henceforth simply referred to as memory 154. Memory 154 may be a read-only memory (ROM), in some implementations. In other implementations, memory 154 may be a random access memory (RAM), or a flash memory, or any other type of memory, or a combination of different types of memory devices.

The logic circuit 152 may process one or more digital input signals provided by SAR ADC 130 corresponding to various analog inputs of the LP PASS 102. For example, speech recognition digital input signals may be processed together with temperature, humidity, atmospheric pressure, and other digital input signals. In some implementations, different digital input signals may be processed by different gates of the logic circuit 152. In other implementations, different digital input signals may be processed by the same gates of the logic circuit 152 but sequentially in time, e.g., so that the processing of the digital input signal s1 may occur over time interval t1, followed by the processing of the digital input signal s2 over time interval t2, followed again by the processing of the digital input signal s1, and so on. The digital outputs of the processing of the various digital inputs by the logic circuit 152 may be temporally, or permanently, or until the next boot, stored in the memory 154.

The digital outputs of the logic circuit 152 may be used to reconfigure various analog blocks and circuits of the LP PASS 102, as indicated schematically by the dashed lines in FIG. 1. For example, the dashed lines extending from the Logic Circuit 152 and the FSM 158 to the AROUTE 114 indicate schematically how reconfiguration of the AROUTE 114 may be performed. In turn, the dashed lines from the AROUTE 114 to the MUXs 110 and 112 indicate that the routing of data by the MUXs 110 and 112 may be reconfigured by the AROUTE 114, e.g., by reconfiguring one or more MUX switches. For example, the LP PASS 102 may be in a first—e.g., a low-power—configuration where the analog blocks (such as CTB/DTB 120, SAR ADC 130) may be configured to process input analog signals with a low resolution compared with the maximum capabilities of the LP PASS. The LP PASS 102, and its logic circuit 152 may nonetheless remain in a stand-by mode capable of monitoring for indications of some events in the input analog signals. For example, the LP PASS 102 may be monitoring audio noise for the instances of human speech. The LP PASS 102 may not be capable of conclusively discerning speech at the lowest LP PASS resolution, but the logic circuit 152 may be able to detect indicia of human speech. For example, the memory 154 may store criteria—such as typical tones and cadence—of a human speech at the set low resolution. If the LP PASS 102 is monitoring the input analog signals for an indication of some event and such indication is obtained in a ultra-low power configuration, which can also be a low-resolution mode, the logic circuit 152 may reconfigure one or more of the analog circuits into a second configuration of the LP PASS 102 to increase the resolution of the analog signal processing and/or analog-to-digital conversion. Correspondingly, the analog circuits may have a higher operating power in the second configuration than in the first configuration. In some implementations, the analog circuits may have a lower operating power in the second configuration than in the first configuration. For example, the first configuration may be used to implement an Active state whereas the second configuration may be used to implement a Sleep state of the LP PASS. As discussed in more detail below, there may be several Active states (such as Active1, Active2, and so on) that are characterized by different levels of the LP PASS functionality and different levels of power consumption. Likewise, there may be different Sleep states (such as Idle, Deep Sleep, and so on).

Different LP PASS configurations may have be characterized by different resolution of the continuous time processing of the input signals as well as different resolution of the output digital signals. For example, digital resolution may be increase from 8 bits to 12 bits and from 12 bits to 16 bits when the LP PASS 102 is reconfigured. Higher resolution may require longer processing time and/or more power consumption. Because the losing the lowest resolution may result in the fastest processing and/or lowest power conversion, the LP PASS 102 may start processing the lowest resolution configuration and but reconfigure itself (e.g., its SAR ADC 130) responsive to detection of indicia of specific events.

In some implementations, to reconfigure the LP PASS 102 into the second configuration, the logic circuit 152 may reconfigure some or all of the blocks CTB/DTB 120, SAR ADC 130, AREF 140, AROUTE 114, MUX 110, and SAR MUX 112. For example, to increase resolution of continuous time processing, the logic circuit 152 may execute instructions to AREF 140 to increase the frequency of the clock signal output by AREF to CTB/DTB 120. In another example, to increase resolution of analog-to-digital conversion, the SAR ADC 130 and CTB/DTB 120 may be reconfigured from, e.g., a 12 bit 20 ksps sampling mode to a 12 bit 1 MSPS sampling mode. In some implementations, the sampling rate may remain the same, but the resolution may increase. Conversely, the sampling rate, but not the resolution, may be increased.

In some implementations, the LP PASS 102 may include a finite state machine block (FSM) 158. The FSM 158 may be hardware-implemented as a circuit (or a set of circuits) separate from the logic circuit 152. In some implementations, FSM 158 may be implemented on the same circuitry as the logic circuit 152. In some implementations, FSM 158 may be implemented as instructions executed by the logic circuit 152. FSM 158 may be capable of receiving an input from the logic circuit 152 or directly from the SAR ADC 130 or from both. Responsive to receiving input, FSM 158 may be capable of selecting one or more of FSM states. FSM states may correspond to settings of any one of the analog circuits, or settings of a plurality of the analog circuits, or settings of the LP PASS 102 as a whole. The state selected by FSM 158 may be used to reconfigure some or all of the blocks CTB/DTB 120, SAR ADC 130, AREF 140, AROUTE 114, MUX 110, and SAR MUX 112.

FSM 158 may be one or more of a Finite State Transducer, an intelligent logic circuit, programmable logic device, controller, inference engine, acceptor, classifier, or sequencer type or any combination thereof. A classifier FSM may be able to select a state from a plurality of available states based on the input. For example, an FSM used by a heart monitoring device may select, depending on the heart rate of the patient, whether to implement heart rhythm corrections, administer electrocardiogram measurements, or to dispatch a communication to a medical professional. An acceptor FSM may be able to produce a binary output. In some implementations, output of state 0 means that no changes to the current configuration of the LP PASS 102 are to be implemented whereas output of state 1 means that the LP PASS 102 has to be reconfigured. In some implementations, selection of LP PASS configuration may be done in sequence: e.g., the output of state 1 means that the configuration with the next available resolution (or power consumption) is to be selected. As an illustrative example, a 12-bit 20 ksps sampling configuration of SAR ADC 130 may be followed by a 12-bit 1 MSPS configuration followed by a 16-bit 62.5 KSPS configuration. The FSM as inference engine, may be used, as a way of example, in speech recognition, such as when the LP PASS 102 may be in a stand-by mode looking for indicia of a code word. The FSM will study the observed phenomena in digital domain (after ADC) and match the data with pre-loaded data in the memory—to make inferences. This FSM can also act as Inference Engine—making key decisions, in image processing and also speech recognition.

Figure 2B:
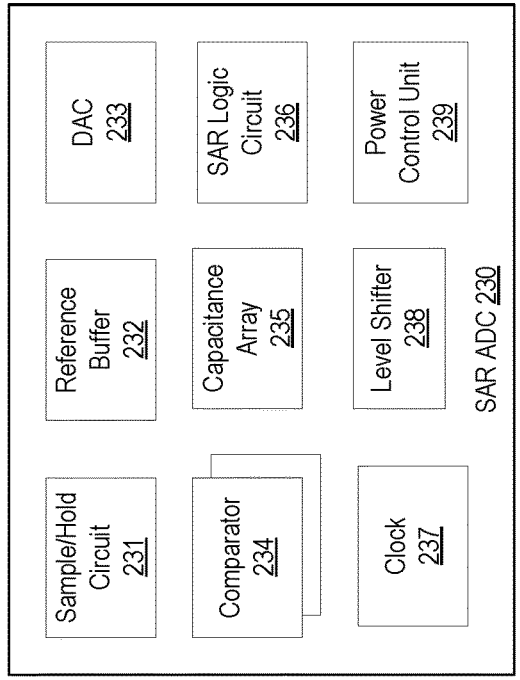
FIG. 2b is a block diagram of one exemplary implementation of a successive approximation register analog-to-digital converter circuit of an exemplary low-power programmable analog subsystem.
Figure 2A:
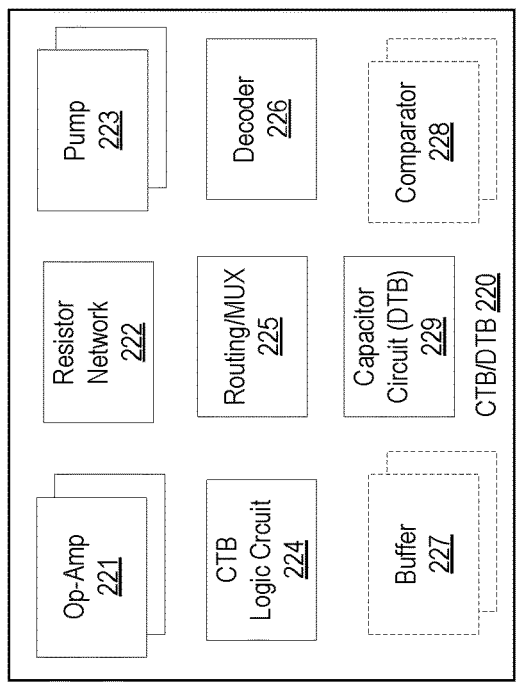
FIG. 2a is a block diagram of one exemplary implementation of a continuous time block (or a discrete time block) of an exemplary low-power programmable analog subsystem.
Figure 2C:
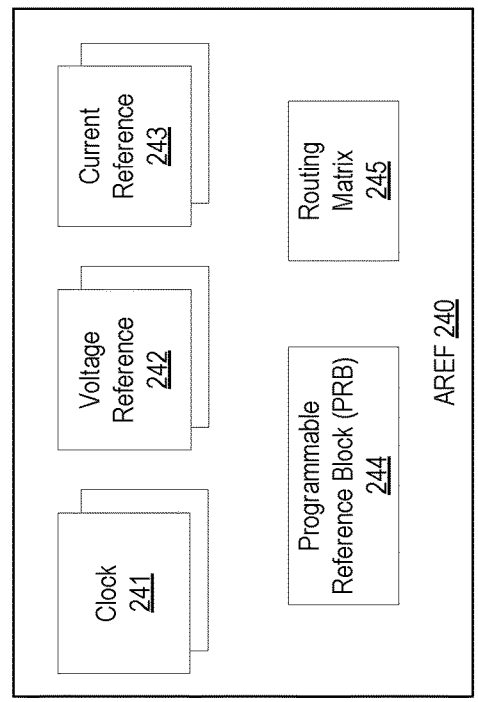
FIG. 2c is a block diagram of one exemplary implementation of an analog reference block of an exemplary low-power programmable analog subsystem.

FIGS. 2a, 2b, and 2c illustrate some possible high-level architectures of a continuous time block (CTB), successive approximation register (SAR ADC), and analog reference block (AREF). Some of the components shown in FIGS. 2a, 2b, and 2c, as well as those in subsequent FIGS. 3 and 4, may be the same as in FIG. 1. Accordingly, items referenced by the three-digit numbers that differ only by the first digit (e.g., CTB/DTB 120, 220, 320, 420), may refer to the same components.

FIG. 2a is a block diagram of one exemplary implementation of CTB/DTB 220 of an exemplary low-power programmable analog subsystem 102. The CTB/DTB 220 may have a sufficient bandwidth to support specified digital sampling rates, such as 12-bit sampling at 1 MSPS or 16-bit sampling at 62.5 KSPS. In some implementations, CTB/DTB 220 may have two or more operational amplifiers 221 and a resistor network 222. In some implementations, CTB/DTB 220 may further include a pump 223, which may be a dual-charge pump. The pump 223 may be used to facilitate operations of the op-amps 221. In some implementations, the CTB/DTB 220 may include an internal logic circuit 224 to control internal routing with firmware-controllable switches. The routing matrix 225 may have a plurality of buses, switches, and latches. The routing matrix 225 may also have multiplexers internal to CTB/DTB 220 that are different from MUX 110. Some or all of the routing switches may be controllable by the components external to CTB/DTB 220, such as the logic circuit 152, the FSM 158, and the AROUTE 114. The routing matrix 225 may connect the CTB/DTB 220 to a plurality of 10 pins of the 10 devices, such as GPIO 104 and PRGIO 106, in some implementations. GPIO pins may be grouped into groups of 8 pins, which may represent separate analog ports. The CTB/DTB 220 may further include a decoder 226 to process encoded inputs. The CTB/DTB 220 may also have a capacitor circuit 229 (e.g., an array of capacitors) for discrete time processing. The components of the CTB/DTB 220 (e.g., the op-amps 221 and the resistor network 222) may be configured to serve as one or more buffers 227 or comparators 228. Some of the components of the CTB/DTB 220 shown in FIG. 2a may be optional and not used in some implementations. For example, the capacitor circuit 229 may not be present in a continuous time block (CTB) implementation of the CTB/DTB 220. In some implementations, a more compact CTBm (CTB-mini) may be used with the same or similar functionality as a typical CTB, but with a smaller capability.

FIG. 2b is a block diagram of one exemplary implementation of a successive approximation register analog-to-digital converter circuit (SAR ADC) 230 of an exemplary low-power programmable analog subsystem 102. The SAR ADC 230 may include a sample/hold circuit 231 to capture the input analog signals (e.g., signals from the SAR MUX 112 and/or CTB/DTB 220) based on a specified sampling frequency. The SAR ADC 230 may also have a reference buffer 232 to store the reference signals (e.g., reference voltage and current) provided by AREF 140. The SAR ADC 230 may also have a digital-to-analog converter (DAC) 233 which may, at discrete time intervals, feed the analog signals into one or more comparators 234. The DAC 233 may also include or be coupled to a capacitor array 235. The comparator(s) 234 may compare input signals stored in the sample/hold circuit 231 with the output of DAC 233, determine the corresponding difference and send this difference to the SAR logic circuit 236. The SAR logic circuit 236 may perform a successive approximation algorithm until the analog signals stored in the sample/hold circuit 231 are digitized to the accuracy specified by the number of bits of the digital output of SAR ADC 230, e.g., 8 bit, 12 bit, 16 bit, depending on the configuration. The SAR ADC 230 may use clock 237 for digital sampling of the input analog signals. The clock may incorporate a timing logic, which may provide different sampling rates at different stages of the analog-to-digital conversion. In some implementations, the SAR ADC 230 may further deploy level shifter(s) 238 to convert low voltage digital control signals into higher voltage analog control signals for an improved signal-to-noise ratio and decreasing power consumption by the SAR ADC 230. The SAR ADC 230 may further include a power control unit 239. Some of the components of the SAR ADC 230 shown in FIG. 2b may be optional and not used in some implementations.

FIG. 2c is a block diagram of one exemplary implementation of an analog reference block 240 of an exemplary low-power programmable analog subsystem 102. AREF 240 may include a clock 241 capable of providing a plurality of configurable clock references to the analog circuits of the LP PASS 102. For example, the clock 241 can provide clock references to the pump 223 of the CTB/DTB 220, to the clock 237 of the SAR ADC 230, and so on. The voltage reference block 242 may provide precise voltage references to some or all of the analog blocks (and circuits inside the blocks) of the LP PASS 102. For example, the voltage reference block 242 may provide a bandgap voltage references, an analog ground voltage reference, an analog power supply voltage reference, and the like. Different analog blocks may receive different voltage references. The current reference block 243 may provide precise current references to some or all of the analog blocks. For example, this may include a current that is proportional to absolute temperature (IPTAT), a current that is independent from absolute temperature (IZTAT), and a current that is complementary (i.e., decreasing with) absolute temperature (ICTAT). Providing a plurality of voltage and current reference values may be facilitated by a programmable reference block (PRB) 244, in some implementations. The PRB 244 may take an input reference voltage (or current) provided by the voltage reference block 242 (current reference block 243), multiply it by a constant and output multiple divided versions of the obtained voltage (current) value, for uses in different blocks of the LP PASS. The output reference voltages (currents) may be routed to the corresponding analog blocks by AROUTE 114. Likewise, clock 241 outputs may also be delivered to the intended destinations by AROUTE 114. The above described operations—voltage/current multiplication and division—performed by the AREF 240 may be facilitated by internal routing matrix 245. The PRB 244 may be capable to receive reconfiguration instructions from the logic circuit 152 or the FSM 158. Responsive to receiving such instructions, the PRB 244 may adjust the voltage or current references produced and output by the AREF 240. Some of the components of the AREF 240 shown in FIG. 2c may be optional and not used in some implementations.

Figure 3:
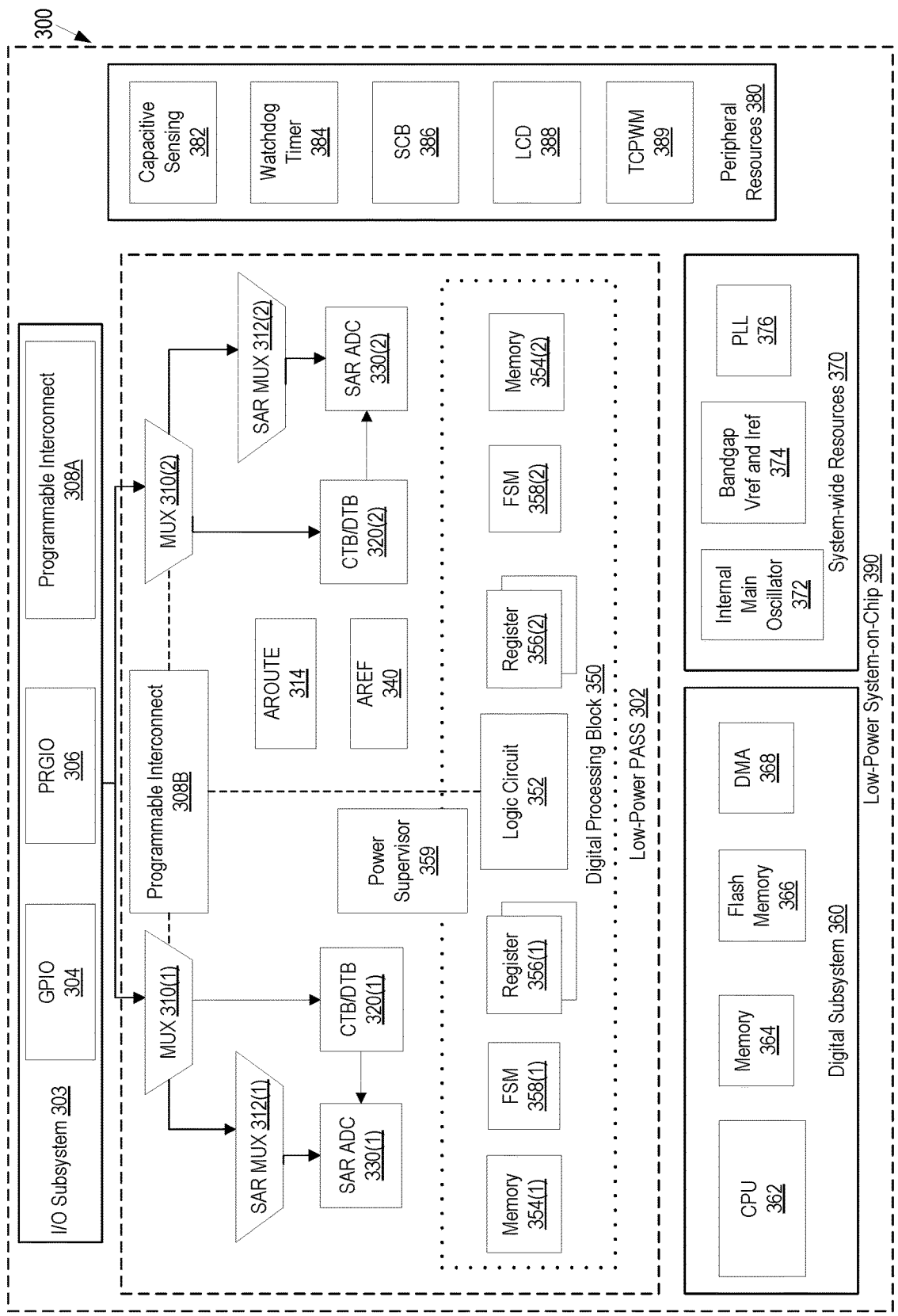
FIG. 3 is a block diagram of another exemplary implementation of a reconfigurable low-power programmable analog subsystem integrated with a digital subsystem, input/output subsystem, system-wide and peripheral resources.

FIG. 3 is a block diagram of an exemplary implementation 300 of a reconfigurable low-power programmable analog subsystem (LP PASS) 302 integrated with a digital subsystem 360, input/output subsystem 303, and peripheral resources 380. The IC system shown in FIG. 3 may be used in a variety of applications, for example but not limited to Internet of Things, wearables, motion detectors, voice activated control appliances, smart home appliances, portable appliances, battery-operated appliances, automotive devices, chemical sensing, medical electronics (e.g., glucose, heart monitoring), and many others. The LP PASS 302 may be in one of a plurality of configurations that differ from each other by the functionality and power consumption, and may be used to implement different states of the LP PASS 302, e.g., DeepSleep, Sleep, Active, in some implementations. Additional states may be implemented, if advantageous in specific applications. For example, a group of Active states may include a number of different states, e.g., Active1, Active2, Active3, and so on, which may differ by the amount and complexity of processing that may be performed by the LP PASS 302. For example, a SAR ADC in Active1 state may operate in a 12-bit low sampling mode whereas in Active3 state it may operate in a 16-bit high sampling mode. The digital subsystem 360 may likewise be in one of a plurality of states. In one of such states, a CPU Off State, the central processing unit (CPU) 362 of the digital subsystem may be inactive. In another state, CPU 362 may be fully active, a CPU On State. Additional intermediate states where CPU 362 may be partially active with different degrees of CPU functionality may also be realized in some implementations.

The LP PASS 302 may include the same blocks as the LP PASS 102 illustrated in FIG. 1. Some of the blocks may be present in more than copy. For example, in an implementation illustrated in FIG. 3, there are two sets of MUXs, CTBs, SAR ADCs, Memory devices, Registers, and FSMs. Each set, designated with the characters (1) and (2) added to the reference numbers, may perform separate processing of the analog signals input through the IO subsystem 303. Each set may be reconfigured independently by the logic circuit 352 and a set-designated FSM, such as the FSM 358(1) for the left set and the FSM 358(2) for the right set. In some implementations, one or more of the devices indicated as separate in FIG. 3 may be shared between the two sets. For example, FSM 358(1) and FSM 358(2) may actually be a single FSM serving both sets. In other implementations, the system illustrated in FIG. 3 may include further sets having additional CTBs and SAR ADCs and other blocks. Additional, sets (third, fourth, . . . ) may be present in other implementations.

The functionality of the multi-set LP PASS 302 may be similar to the functionality of the single-set LP PASS 102. The IO subsystem may include GPIO 304, PRGIO 306, and Programmable Interconnect (PI) 308A. The PI 308A may control what input signals are delivered to the LP PASS 102 from the GPIO 304 and/or PRGIO 306. The LP PASS may additionally have a PI 308B as part of the LP PASS 302. In some implementations, the PI 308B may distribute incoming analog signals between different sets of analog circuits. For example, chemical and physical sensing inputs may be directed to MUX 310(1) while audio signals may be directed to MUX 310(2). Routing of signals inside the LP PASS 302 may be done by the AROUTE 314 and reference values to both sets of analog circuits provided by the AREF 340. The logic circuit 352 may be configured to receive digital inputs from some or all CTBs 320 and to produce one or more digital output values. Some of the output values may be binary functions (0 or 1) of the input analog signals. For example, the input sound signal may result in the binary output 1 if the input contained a code word and in the binary output 0 if the input did not contain the code word. Some output values may be multi-bit digital numbers which may represent input analog signals in a quasi-continuous manner. For example, a detected ambient temperature or chemical composition of air or water may be represented by a quantity having a significant resolution (accuracy). The PI 308B may be controlled by the logic circuit 352 which may control how input signals are distributed within the LP PASS 302 by reprogramming the PI 308B, as shown schematically in FIG. 3 by dashed lines. The LP PASS 302 may also have a power supervisor 359 to control a power level of the LP PASS as well as the timing of for powering up/down of various blocks of the LP PASS 302. Timing may include specific instances of powering up/down (including complete and partial reduction in power) as well as duration of the powering up/down transitions. The power supervisor 359 may provide supervisory functionality to both the analog blocks of the LP PASS 350 and the digital processing block 350. The power supervisor 359 may be controlled by the logic circuit 352 and/or the FSM 354. In some implementations, the power supervisor 359 may have its own internal logic and may be capable of operating autonomously from the logic circuit 352/FSM 354.

The logic circuit 352 or the FSM 358 may determine if one or more output values satisfy a first criteria. In some implementations, the first criteria may be represented by a first threshold value and the first criteria is satisfied if the output value exceeds the first threshold value. In some implementations, the first criteria is satisfied if the output value is below the first threshold value. The plural term "criteria" is understood in the present disclosure as encompassing both its dictionary—plural—meaning and the related singular meaning ("criterion"). Accordingly, the term "first criteria" (or "second criteria" and the like) encompasses implementations where a single output value may be compared with a single threshold value as well as implementations where a plurality of output values may be compared with a plurality of threshold values. Similarly, a singular term "threshold value" should be understood as also encompassing implementations having a plurality of threshold values.

The first threshold value may be stored in memory 354(1) or 354(2). In some implementations, the first threshold value may be stored in the registers 356(1) or 356(2). In some implementations, the first threshold value may be stored in the settings of the FSMs 358(1) or 358(2). If it is determined that the first criteria is satisfied, the logic circuit 352 and/or the corresponding FSMs 358 may reconfigure the LP PASS 302 from a first PASS configuration to a second PASS configuration having a different configuration setting. The configuration setting may include parameters that determine a functionality of at least one programmable analog circuits, such as clock rate of CTB/DTB 320, resolution and sampling rate of the SAR ADC 330, routing fabrics of AROUTE 314, analog references of AREF 340, and the like. The setting(s) for the second PASS configuration may be stored in memory 354, registers 356, or in the settings of the FSMs 358. In some implementations, registers 356 may be implemented in ROM and configuration settings stored in them may not be modified. In some implementations, registers 356 may be RAM-implemented and may be modified by the CPU 362 of the digital subsystem 360. In some implementations, some configuration settings may be stored in RAM (either memory 354 or registers 356) while other configuration settings may be stored in ROM (either memory 354 or registers 356). In some implementations, configuration settings may be stored in registers 356 whereas data collected by the LP PASS 302 may be stored in memory 354. In some implementations, the configuration settings may represent the states of one or more switches of one or more of CTB/DTB 320, SAR ADC 330, AROUTE 314, AREF 340, and the like.

When the LP PASS 302 is in the first configuration, the CPU 362 of the digital subsystem 360 may be in the CPU Off State. When the LP PASS 302 is reconfigured into the second configuration, the CPU may remain in the CPU Off State. The LP PASS 302 may continue receiving and processing the analog input signals in the second configuration. The logic circuit 352 or the FSM 358 may subsequently determine that one or more output values in the second configuration satisfy a second criteria. For example, the output value of the logic circuit 352 may be above (or below) the first second threshold value. If this happens, the logic circuit 352 may output a wake-up signal to the CPU 362 through a digital interface (not shown) and trigger CPU transition into the CPU On State. In some implementations, the wake-up signal may be an instruction, such as a digital instruction, for the CPU to wake up. In other implementations the wake-up signal may be a data signal that contains no instruction to the CPU 362 but such that causes the CPU 362 to wake up. In the On State, the CPU 362 may load instructions from the memory 364 of the digital subsystem 360 and execute a digital code. As a result of the code execution, the CPU 362 may send configuration data with instructions to the LP PASS 302 (e.g., to the logic circuit 352 and/or to the FSMs 358) to reconfigure the LP PASS to a third PASS configuration. The settings for the third configuration may be retrieved from the LP PASS memory 354 or registers 356, in some implementations. In some implementations, the CPU 362 may first store configuration settings into one or more RAM devices of the LP PASS 302 (e.g., to memory 354 or registers 356) and instruct the logic circuit 352 to fetch these stored settings. In some implementation, the CPU 362 may modify the settings of various analog blocks of the LP PASS 302 directly, without involvement of the logic circuit 352. In some implementations, the CPU 362 may load new configuration settings into memory 354 or registers 356 upon an occurrence of some predetermined condition. For example, when the LP PASS 102 detects smoke in the ambient air, the LP PASS 102 may output a wake-up signal to the CPU 362 and the CPU 362 may load new configuration settings to reconfigure the LP PASS 102 from detection of a smoke to determining its chemical composition. In some implementations, the CPU 362 may load new configuration setting into memory 354 or registers 356 independent of the input signals, simply as part of an update, e.g., a scheduled (at a specific time of day) update.

In some implementations, the LP PASS 302 in the second configuration may not receive a second analog input signal. Rather, upon reconfiguration (and without waking up CPU 362), the LP PASS 302 may reprocess the first analog input signal stored during the initial processing that was performed in the first PASS configuration. For example, the first analog input signal may be stored in the sample/hold circuit 231 of the SAR ADC 330. After the LP PASS 302 is reconfigured into the second configuration, e.g., having a higher SAR ADC sampling rate, the reconfigured SAR ADC 330 and the logic circuit 352 may reprocess the stored input signal with a new (higher) resolution to determine a new output value. This new output value may then be compared to the second threshold value and a decision may be made whether to wake up the CPU 362 from its Off State.

In some implementations, after receiving and processing the analog input signals, the LP PASS 302 may output to the CPU 362 a signal that is different from a wake-up signal. In some implementations, the signal output to the CPU 362 is a mode selection signal. For example, in some implementations, the CPU 362 may be initially in the CPU On State and the logic circuit 352 may output a signal to the CPU 362 that causes the CPU 362 to transition to the CPU Off State. In some implementations, the mode selection signal may cause the CPU 362 to transition between different active modes (states).

In some implementations, the LP PASS 302 may output no wake up instruction to the CPU while undergoing multiple reconfigurations into configurations with progressively escalating functionality (e.g., speed, accuracy, and resolution) and power consumption before the CPU 362 is finally woken up. For example, the sequence of LP PASS states may be: Sleep, Active1, Active2, Active3, followed by a wake-up instruction to the CPU 362. In some implementation, the LP PASS 302 may reverse and deescalate without waking the CPU 362 if it is determined that no active CPU involvement or input is necessary: Active1, Active2, Active3, Active2, Active1. In some implementations, the LP PASS 302 may deescalate into Sleep (or DeepSleep) state. In some implementations, the LP PASS 302 may periodically reconfigure itself into one of the Active states at the beginning of a monitoring time period and revert back into Sleep (or DeepSleep) state at the end of such period.

The digital subsystem 360 may be a general purpose processing system or a special purpose processing system configured to execute a limited number of instructions. In some implementations, the digital subsystem 360 may be a microcontroller unit (MCU). The digital subsystem 360 may include flash memory 366, direct memory access circuit (DMA) 368, as well as other conventional components, such as monitors, IO devices, network adapters, and so on. The digital subsystem 360 may have access to a cloud storage. Some or all of the computing performed by the digital subsystem 360 may be a remote (e.g., cloud) computing.

The system 300 may have a number of system-wide resources 370, such as an internal main oscillator 372 and a reference block 374 to provide voltage and current to the components of the digital subsystem and, in some implementations, to AREF 340. The system-wide resources may also include a phase lock loop (PLL) 376 to generate phase-locked reference signals. The system 300 may also have a number of peripheral resources 380, which may include capacitive sensing arrays 382, a watchdog timer 384, a serial communication block 386, a liquid crystal display 388, and a timer counter pulse width modulator (TCPWM) 389.

In some implementations, all components of the system 300 may be implemented on the same chip (substrate), as illustrated by the dashed rectangle Low-Power System-on-Chip (SoC) 390. In some implementations, some of the components of the system 300 may be implemented off-chip. For example, some or all of the peripheral resources 380 and/or IO subsystem 303 may be implemented off-chip and connected to the chip hosting the LP PASS 302 and the digital subsystem 360 by one or more buses (not shown). In some implementations, the LP PASS 302 and the digital subsystem 360 may be implemented as separate SoCs on different (e.g., Si) substrates.

Figure 4:
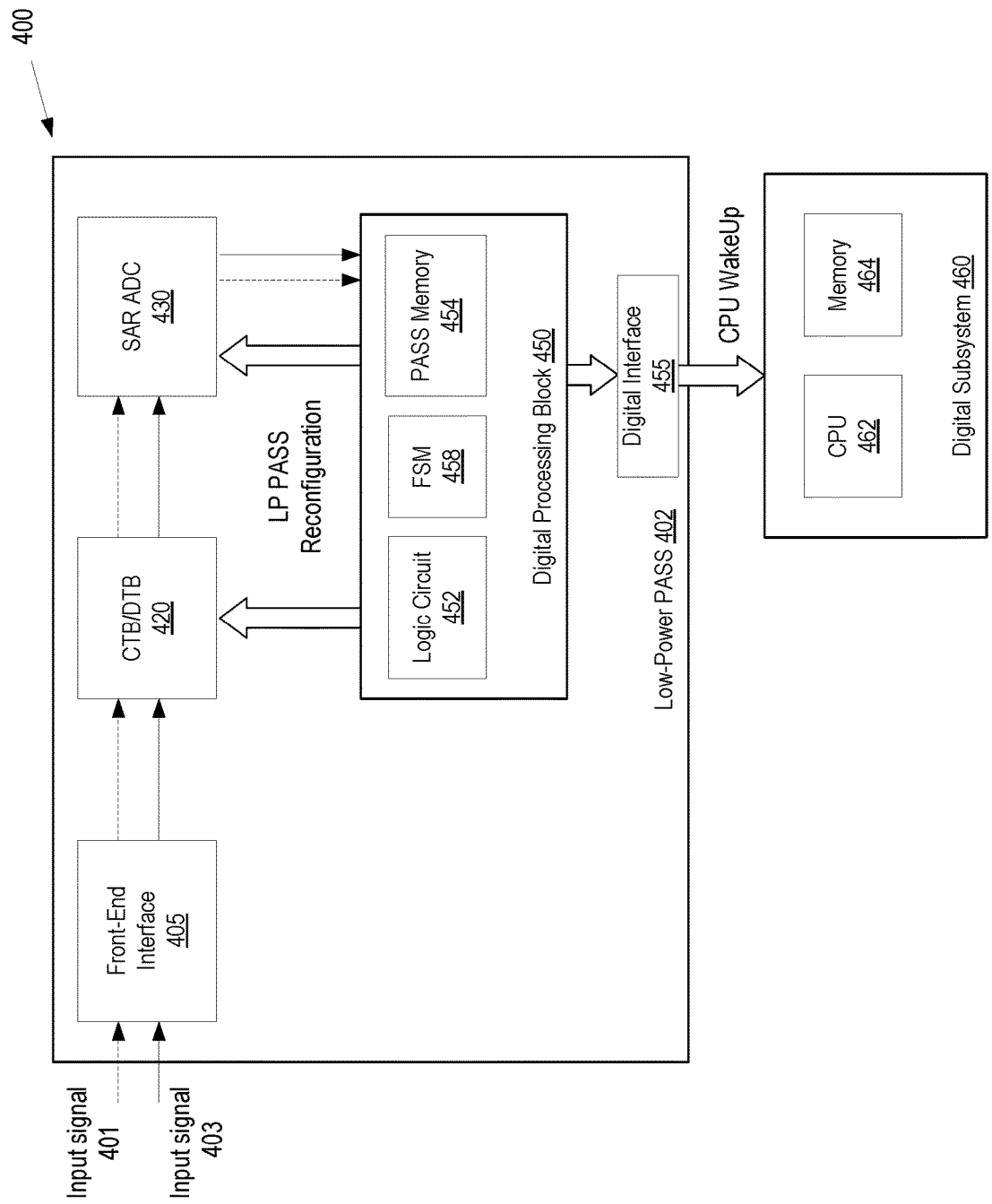
FIG. 4 is a block diagram of one exemplary illustration of processing of input signals, having various input levels, by a reconfigurable low-power programmable analog subsystem integrated with a digital subsystem, in one possible implementation.

FIG. 4 is a block diagram of one exemplary illustration 400 of processing of input signals, having various input levels, by a reconfigurable low-power programmable analog subsystem (LP PASS) 402 integrated with a digital subsystem 460, in one possible implementation.

The LP PASS 402 may be a single-set apparatus shown in FIG. 1, a two-set apparatus illustrated in FIG. 3, or a multiple-set apparatus. FIG. 4 illustrates the functionality of the LP PASS 402 in two exemplary situations. In the first situation, an input signal 401 has an input level above a first threshold criteria for reconfiguration of the LP PASS 402. Yet the input level of the signal 401 may be below a second threshold criteria. As a result, the LP PASS 402 reconfigures itself but does not output a signal to the CPU 462. In some implementations, the term "input level" may refer to a voltage level, a current level, a level indicating a charge, or any other physical or chemical quantity, or a change in any physical or chemical quantity. In the second situation, an input signal 403 has an input level that is above the second threshold criteria for outputting a signal to the CPU 462. The input signals 401 and/or 403 are first received by a front-end interface 405. The front-end interface 405 may perform pre-processing of the input signals 401 and/or 403. For example, the front-end interface 405 may include a microphone to convert audio signals to electrical signals that can be recognized by the LP PASS analog circuitry, or a plurality of radio circuits and devices (antennas, amplifiers, filters, etc.) to convert radio waves into electrical signals. The front-end interface 405 may include any components of the IO subsystem 303 and MUXs 310, 312. The signals pre-processed by the front-end interface 405 may be input to the CTB/DTB 420 for continuous or discrete time processing and then to the SAR ADC 430 for conversion into digital values. The CTB/DTB 420 and/or SAR ADC 430 may initially have settings corresponding to a first LP PASS configuration. The signals digitized by the SAR ADC 430 may be input to the digital processing block 450, more specifically, to the logic circuit 452 and/or FSM 458. The logic circuit 452 and or FSM 458 may generate one or more output values and determine whether the output values satisfy one or more criteria, such as the first criteria for LP PASS 402 reconfiguration and the second criteria for outputting a signal to the CPU 462, in some implementations.

If the logic circuit 452 and/or the FSM 458 determine that for the input signal 401 the first criteria are satisfied but the second criteria are not satisfied, the logic circuit 452 and/or the FSM 458 may reconfigure the LP PASS 402 into the second PASS configuration.

In some implementations, the first criteria may include a plurality of metrics. Depending on the application of the plurality of metrics to one or more output values, the second PASS configuration may be selected from more than one possible configuration. In some implementations, if a certain subset of the first criteria is satisfied, the reconfiguration of the LP PASS 402 may be performed with the help of one or more of the pre-configured states of the FSM 458. The FSM 458 may be used to facilitate fast reconfiguration of the LP PASS 402. If none of the subset of the first criteria is satisfied, so that none of the pre-configured states of the FSM 458 is to be selected, the reconfiguration of the LP PASS 402 may be performed by the logic circuit 452. In some implementations, the settings for the second configuration of the LP PASS 402 may be retrieved from the LP PASS memory 454. In some implementations, the LP PASS memory 454 may include one or more ROM registers, e.g., registers 356 to store configuration settings.

The settings for the selected second PASS configuration may be applied to the front-end interface 405, CTB/DTB 420, the SAR ADC 430, and other LP PASS blocks not explicitly shown in FIG. 4 (such as the AROUTE, AREF), as indicated by open arrows. The LP PASS 402 may subsequently process additional inputs. In some implementations, the LP PASS 402 may first re-process the initial input signal (e.g., the input signal 401) with increased resolution. The input signals may be stored for such subsequent processing in one or more buffers (e.g., in the sample/hold buffer 231) of the LP PASS 402.

When a super-threshold input 201 is processed by the LP PASS 402, the logic circuit 452 and/or the FSM 458 may determine that the output value(s) satisfy the second criteria. Responsive to determining that the second criteria is satisfied, the digital processing block may output a wake up instruction to the digital subsystem 460 via the digital interface 455 to wake up the CPU 462 from its CPU Off State. Responsive to the signal from the LP PASS 102, the CPU 462 may transition into the CPU On State. The wake up instructions may contain an interrupt message describing a reason for the wake up. The CPU 462 may then load (e.g., from memory 464) and execute a particular code responsive to the specific reasons contained in the interrupt message. In some implementations, the CPU 462 may output instructions to the LP PASS 402 to transition into a third PASS configuration. The third PASS configuration may be used to implement one of the Active LP PASS states, in some implementations. In other implementations, the third PASS configuration may be used to implement a Sleep or Deep-Sleep state. In some implementations, the CPU 462 may not output any reconfiguration instructions to the LP PASS 402 but the LP PASS 402 may reconfigure itself into the third configuration according to one of the procedures described above.

In some implementations, when the LP PASS 402 is in one of its Active states and the CPU 462 is in its CPU On State, the LP PASS 402 and the CPU 462 may be processing the same task, e.g., speech recognition. In other implementations, the LP PASS 402 and the CPU 462 may be processing different tasks. For example, the LP PASS 402 may be monitoring air humidity whereas the CPU 462 is adjusting the heating system. As another example, the LP PASS 402 may be monitoring the brightness of natural lighting transmitted through smart windows whereas the CPU 462 is optimizing air conditioning parameters. When the current task has been accomplished, the CPU 462 may transition into the CPU Off State and output further configuration instructions to the LP PASS 402. In some implementations, the LP PASS may receive indication that the CPU 462 has transitioned into the CPU Off State and reconfigure itself without CPU involvement or input into a default state (e.g., Sleep or Active1).

In some implementations, the signal output by the LP PASS 102 to the CPU 462 may be a wake-up instruction. Responsive to receiving such instruction, the CPU 462 may wake up from its CPU Off State. In some implementations, the output signal may be an interrupt signal to the CPU 462, which may be in the CPU On State but processing other tasks, e.g., tasks unrelated to the tasks performed by the LP PASS 402. Responsive to receiving an interrupt instruction, the CPU 462 may not change its state, but may interrupt the task it is currently performing and switch to a different task, e.g., reconfiguring the LP PASS 402, as explained above. In some implementations, the output signal may be a "sleep" signal to the CPU 462 to switch to the CPU Off State. For example, such signal may be output by the LP PASS 402 responsive to non-occurrence of a certain event within a pre-determined period of time.

Figure 5A:
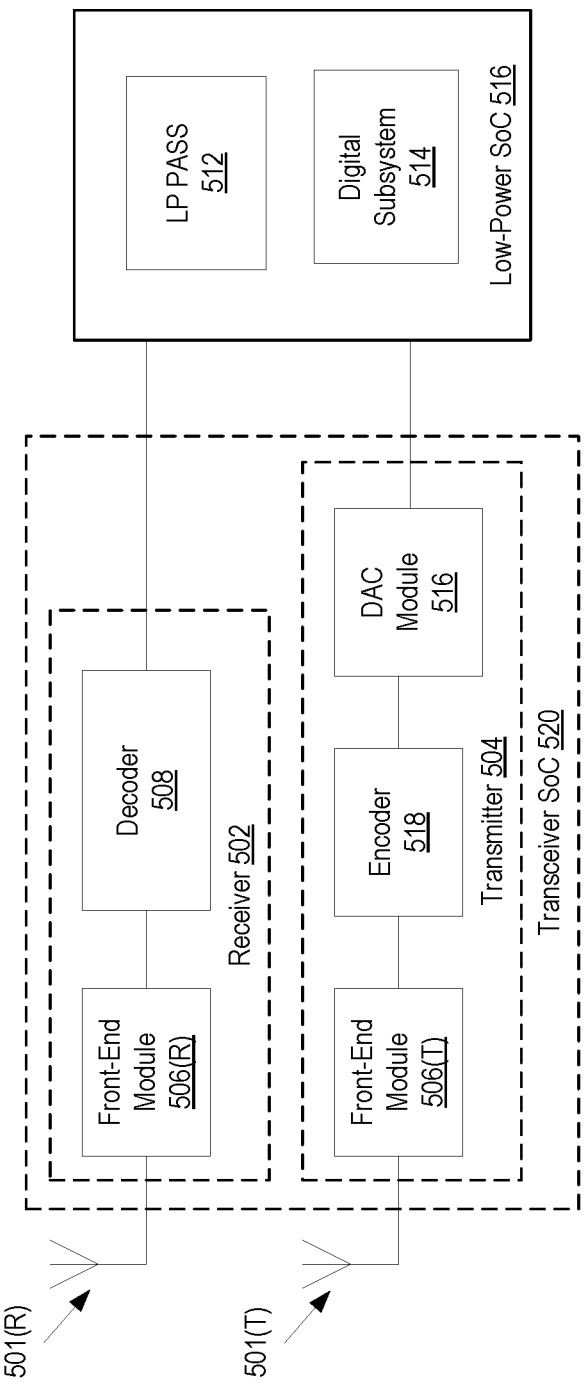
FIG. 5a is a block diagram of one exemplary implementation of application of a reconfigurable low-power programmable analog subsystem using radio reception and transmission.

FIG. 5a is a block diagram of one exemplary implementation 500(a) of application of a reconfigurable low-power programmable analog subsystem (LP PASS) using radio reception and transmission. The implementation shown may be used as part of an Internet-of-Things controller. The implementation shown may use as an interface with Cloud or other digital and/or analog devices using a local area network, a personal area network, or any other networks and protocols based on radio reception and/or transmission. One or more antennas 501 may be used for reception and transmission of radio waves by a receiver 502 and a transmitter 504. In some implementations, the receiver 502 may use a receiver antenna 501(R) while the transmitter 504 may use a separate transmitter antenna 501(T). In other implementations, a single antenna may be used for both transmission and reception. For example, the antenna may be a multiple-input and multiple-output (MIMO) antenna. The radio signal received by the antenna 501(R) may be fed into the receiver front-end module (FEM-R) 506(R). The FEM-R 506(R) may include multiplexers, filters (e.g., band-pass filters), low-noise radio-frequency amplifiers, down-conversion mixer(s), frequency-shift and/or amplitude-shift keying modules, and other circuitry that may be used to process radio signals. In some implementations, the output of the FEM-R 506(R) may be processed by a decoder 508.

The output of the receiver 502 may be provided to the LP PASS 512. The LP PASS 512 may be either one of the LP PASSs 102, 302, 402, or the like. The LP PASS 512 may be in one of the low-power states, as disclosed above. The LP PASS 512 may be able to reconfigure itself, as well the FEM-R 506(R), responsive to the analog and digital processing of the signals received by the antenna 501(R). In some implementations, the LP PASS 512 may be capable of transmitting radio signals via the transmitter 504 and the antenna 501(T). The signal to be transmitted may be stored in the memory of the LP PASS 512 and selected by the FSM of the LP PASS 512 when the digital output of the LP PASS 512 meets one or more of pre-determined criteria. In some implementations, the signal to be transmitted may be determined by the logic circuit of the LP PASS 512. The signal may be converted into an analog form by the digital-to-analog converter (DAC) module 516. In some implementations, the signal may be encoded by an encoder 518 and provided to the transmitter front-end module FEM-T 506 (T). The FEM-T 506(T) may include multiplexers, filters (e.g., band-pass filters), low-noise radio-frequency amplifiers, down-conversion mixer(s), frequency-shift and/or amplitude-shift keying modules, and other circuitry.

The LP PASS 512 may be manufactured together with the digital subsystem 514 on the same chip (e.g., same Si substrate), e.g., as a low-power system-on-chip (SoC) 516. In some implementations, the SoC 516 may be the SoC 390. The digital subsystem 514 may include a CPU, a memory, and a digital interface. In some implementations, the digital subsystem 514 may be an MCU. During radio signal processing described above, the digital subsystem 514 may be in the CPU Off State. In some implementations, when digital outputs of LP PASS 512 meet one or more criteria for waking up the CPU, the digital subsystem 514 may take over radio reception and/or radio transmission. The digital subsystem 514 may also reconfigure the LP PASS 512, as described above in reference to FIGS. 3 and 4.

In some implementations, the receiver 502 and the transmitter 504 may be mounted on the same chip, e.g., the transceiver SoC 520. In some implementations, the transceiver SoC 520 may be an Internet of Things (IoT) chip. In some implementations, the receiver 502, the transmitter 504, and the LP PASS 512 may be mounted on the same chip. In some implementations, the receiver 502 and the transmitter 504 may share some components. For example, the FEM-R 506(R) and the FEM-T 506(T) may share filters, amplifiers, and/or other components, or be implemented as a single module. In some implementations, the receiver 502, the transmitter 504, and the LP PASS 512 may be mounted on the same chip. In some implementations, the receiver 502, the transmitter 504, the LP PASS 512, and the digital subsystem 514 may be mounted on the same chip. In some implementations, one or more network adapters may be used in place of the receiver 502 and the transmitter 504, and data streaming (e.g., to/from a network, cloud) may be used instead of radio reception/transmission.

Figure 5B:
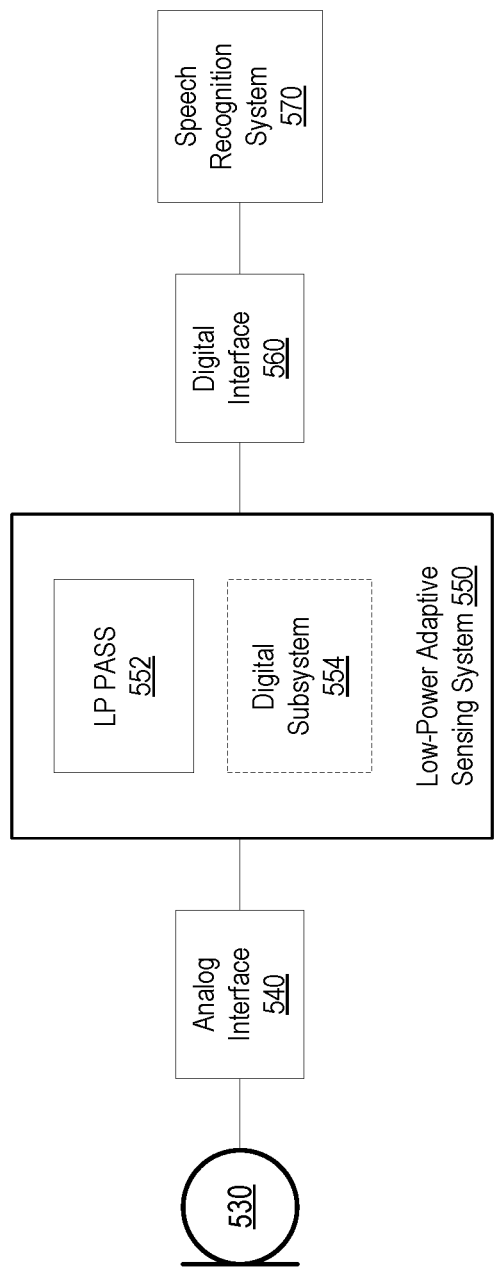
FIG. 5b is a block diagram of illustrating application of a reconfigurable low-power programmable analog subsystem for speech recognition, in one exemplary implementation.

FIG. 5b is a block diagram of one exemplary implementation 500b of application of a reconfigurable low-power programmable analog subsystem for speech recognition. The implementation 500b may be used, including but not limited to, in the context of wearables, Internet of Things, automotive, or general purpose applications. In an exemplary illustration of FIG. 5b, a sound signal may be detected by a microphone 530 and transmitted through an analog interface 540 to a low-power adaptive sensing system 550, which may include an LP PASS 552 and a digital subsystem 554. The low-power adaptive sensing system 550 may be used in a noisy environment to help detect and discern human speech, in one exemplary implementation. The digital subsystem 554 may have a CPU that may be in the CPU Off State when no active speech is currently being detected. In some implementations, the LP PASS 552 may be in one of the Active states or in one of Sleep or DeepSleep states. For example, the LP PASS 552 in the Sleep state may have its logic circuit shut down and its SAR ADC configured to have minimum resolution (e.g., 8-bit 1 ksps) and the lowest sampling rate. Upon detection of a specific event—such as detection of a signature of a human speech—the LP PASS 552 may reconfigure itself into one of the Active states. For example, the FSM of the LP PASS 552 may respond to the signature of a human speech and shift the LP PASS 552 into one of the Active states. In the new configuration, the logic circuit the LP PASS 552 may be woken up and the digital resolution and the sampling rate of the SAR ADC may be increased, e.g., to 16-bit 44.1 ksps, in one illustrative non-limiting implementation. In the new state, the LP PASS 552 may continue monitoring the input audio signals delivered through the analog interface 540 for further signatures of human speech. If no speech is detected, the LP PASS 552 may revert back to the default mode (e.g., 8-bit 1 ksps) after a certain pre-determined time has elapsed.

If more speech is detected, however, the LP PASS 552 may wake up the CPU of the digital subsystem 554. The CPU may further reconfigure the LP PASS 552 and/or the analog interface 540 and begin outputting the detected speech to a speech recognition system 570 through a digital interface 560. In some implementations, the digital subsystem 554 may be absent, and when a positive determination that a speech is being detected has been made, the LP PASS 552 may wake up the speech recognition system 570 and output the (digitized) audio signal through the interface 560.

In some implementations, the microphone 530 may be replaced with a radio front end or a network adapter, or any other device capable of delivering an audio signal. In some implementations, the analog interface 540 and the digital interface 560 may be mounted on the same chip with the LP PASS 552.

Figure 6:
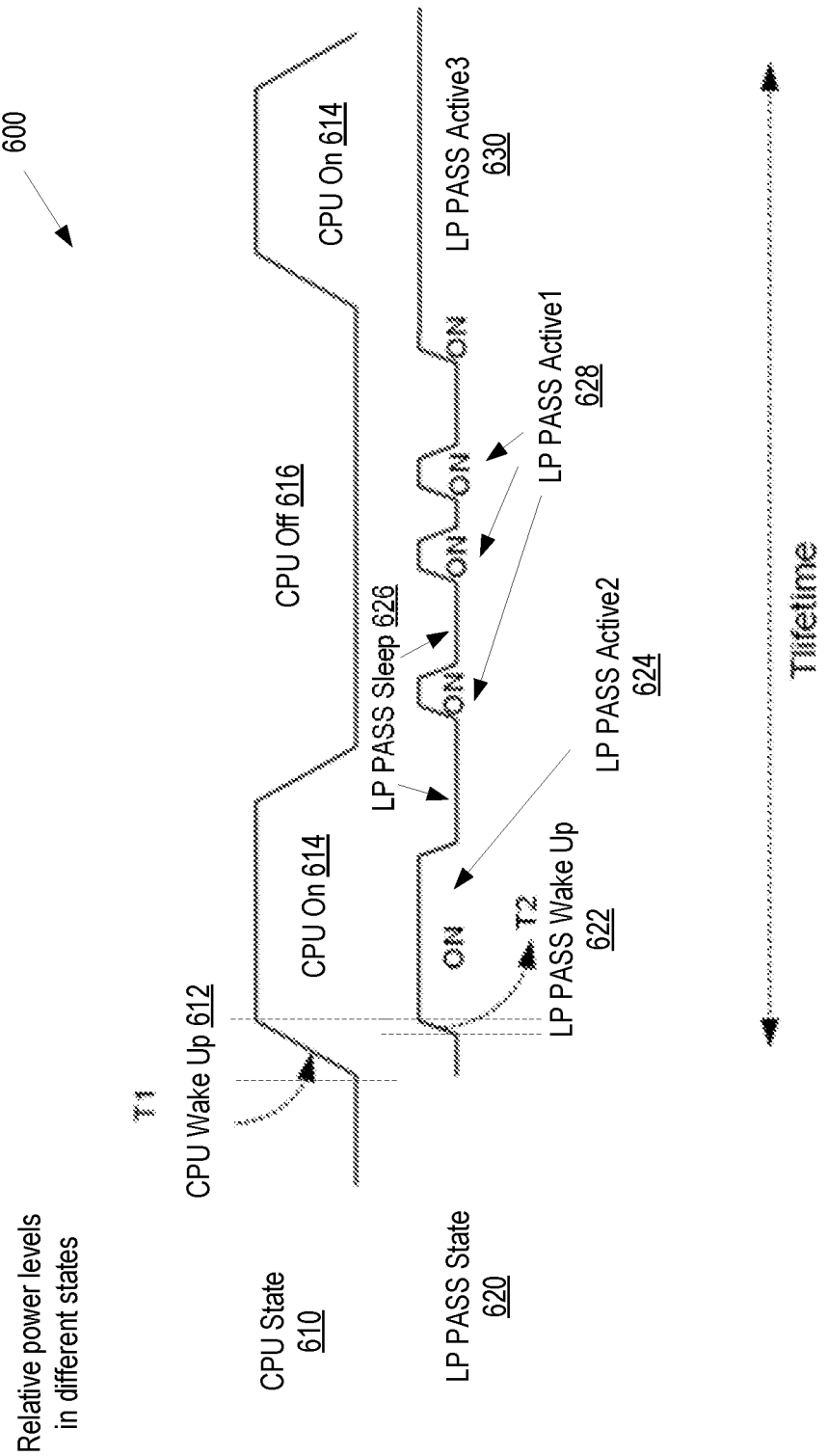
FIG. 6 is a timing diagram showing relative power levels for different states of a system that includes a reconfigurable low-power programmable analog subsystem and a digital subsystem that contains a central processing unit (CPU), for various exemplary states of the two subsystems, in one illustrative implementation.

FIG. 6 is a timing diagram 600 showing relative power levels for different states of a system that includes a reconfigurable low-power programmable analog subsystem and a digital subsystem that contains a central processing unit (CPU), for various exemplary states of the two subsystems, in one illustrative implementation. FIG. 6 may illustrate, in qualitative terms, power levels of any one of the systems shown in FIGS. 3, 4, 5a, and 5b, as applicable. The upper graph illustrates, in conceptual form and not by way of limitation, power levels of the digital subsystem, depending on its CPU state. The lower graph illustrates, in conceptual form and not by way of limitation, power levels of the LP PASS depending on its state that may depend on the configuration of its blocks. Time T1 illustrates, in qualitative terms, a time of CPU wake up 612 for the CPU (or the entire digital subsystem) to transition from a CPU Off State to a CPU On State. Time T2 illustrates, in qualitative terms, a time of LP PASS wake up 622 for the LP PASS to transition from the LP PASS Sleep to one of the LP PASS Active states. As shown in FIG. 6, the time T2 may be significantly shorter than the time T1. Furthermore, the power consumption by the digital subsystem in the CPU On State may be significantly greater than in one of the LP PASS Active states (or configuration modes), as depicted schematically by the height of the two graphs.

Depending on the triggering event that wakes up the LP PASS, the LP PASS may be reconfigured into one of the Active states, such as Active1, Active2, Active3, and so on. In the absence of a triggering event, the LP PASS may transition into one of the Active states (by changing configurations of one or more blocks) at specified time intervals, per a wake-up schedule. For example, every 1 second the LP PASS may transition from LP PASS Sleep state into LP PASS Active1 state and every 10 seconds the LP PASS may transition from LP PASS Sleep state into LP PASS Active2 state. Various LP PASS states may differ by LP PASS functionality and power consumption. In some instances, waking up the LP PASS may follow (and be caused by) the waking up of the digital subsystem.

In other implementations, the lengths of time intervals may be much shorter. For example, a period of a duty cycle of the LP PASS may be 50 μs in one implementation, with the first 44 μs of each cycle spent in the LP PASS Sleep state and the next 6 μs spent in the LP PASS Active1 state. In the Sleep state, the LP PASS may be in an ultra-low power state waiting for a wake-up interrupt. In the Active1 state, the LP PASS may have the analog front-end (e.g., CTB) active with the SAR ADC configured to perform a single conversion, store the result in LP PASS memory, and compare it with the LP PASS reconfiguration or CPU wake-up criteria. Once every N cycles (e.g., N=10), the LP PASS may be reconfigured into the Active2 (or Active3) state with higher (or ultimate) functionality of the LP PASS circuits. The LP PASS may remain in such state for 20 μs (or any other pre-determined time), and then revert back to the Sleep state.

FIG. 6 illustrates, by way of example, a number of various possibilities. Before the start of the timeline, the CPU (or the entire digital subsystem) is in the Off State and the LP PASS is in the Sleep state. At the start of the indicated timeline, the CPU is woken up and undergoing transition into the On State 614. This transition 612 may be caused by a user, by an external event (such as a wake-up call received over a network), or may occur according to a wake-up schedule. Following the CPU wake up 612, the CPU may send a wake-up call 622 to the LP PASS and reconfigure the LP PASS into one of its active states 624—Active2, as illustrated. At the completion of a processing task, the CPU may reconfigure the LP PASS back into the LP PASS Sleep state 626. Subsequently, the CPU itself undergoes a transition into the CPU Off State 616. With the CPU in the Off State, the LP PASS may experience a series of transitions into one or more of its Active states. These are shown in FIG. 6 as LP PASS Active1 628 states. Some of these states may be performed as disclosed above. For example, the LP PASS may be monitoring outside analog inputs, generating digital outputs, and comparing the digital outputs to one or more criteria (e.g., threshold values) to determine whether to reconfigure the LP PASS. Some of the reconfigurations may occur after a pre-determine time interval has elapsed without the output value meeting the reconfiguration criteria. After the LP PASS has accomplished the necessary tasks during its Active1 628 stints (such as speech monitoring or adjusting heating/ac settings), the LP PASS may return into the LP PASS Sleep states 626. In some instances, the output values may be such that criteria for reconfiguration of the LP PASS into a third—e.g., the LP PASS Active3 630—state are met. In addition to reconfiguring itself into Active3, the LP PASS may (as shown in FIG. 6) send wake-up instructions to the CPU and cause its transition into the CPU On State 614. The examples shown in FIG. 6 are not exhaustive, as many other combinations and scenarios are possible. For example, in addition to the two CPU states (CPU On and CPU Off), other additional states of the digital subsystem are possible that may differ by the level of CPU functionality and power consumption. The drawings of FIG. 6 are illustrative and should not be interpreted restrictively. For example, although the power consumption in the three LP PASS state is shown at the same level, in general this does not have to be so and various LP PASS states may be characterized by different levels of power consumption.

Figure 7:
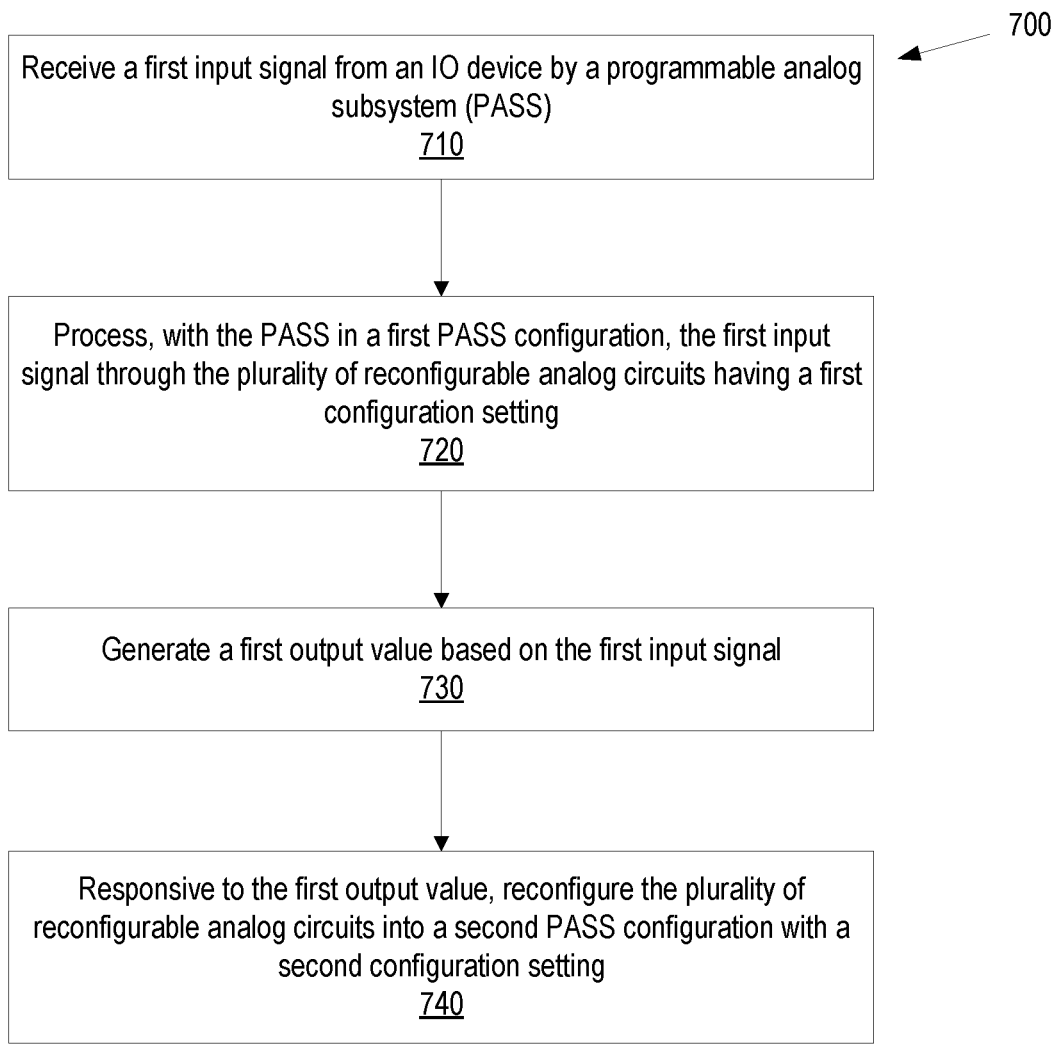
FIG. 7 is a flow diagram of one possible implementation of a method of reconfiguration, in response to an input signal, of a low-power programmable analog subsystem.

FIG. 7 is a flow diagram of one possible implementation of a method 700 of reconfiguration, in response to an input signal, of a low-power programmable analog subsystem. Method 700 may be performed by a logic circuit and/or FSM of the LP PASS that may include hardware (e.g., circuitry, dedicated logic, programmable logic, microcode, etc.), software, firmware or a combination thereof. The LP PASS may be one of the LP PASSs 102, 302, 402, 512, or 552. The logic circuit may be one of the logic circuits 152, 352, or 452. The FSM may be one of the FSMs 158, 358, or 458. The method 700 may include receiving a first input signal from an IO device by a PASS coupled to the IO device, the PASS having a plurality of reconfigurable analog circuits and an interface to communicate data with a CPU (710). The IO device can be any device capable of inputting analog signals, include one or more pins, switches, or sensors. In some implementations, the IO devices may include a radio front end processing, a coaxial cable, an optoelectronic fiber, and so on.

The method 700 may continue with processing, with the PASS in a first PASS configuration, the first input signal through the plurality of reconfigurable analog circuits, wherein the plurality of reconfigurable analog circuits have a first configuration setting in the first PASS configuration (720). The reconfigurable PASS circuits may include some or all of the circuits shown in FIGS. 1-4, such as CTB, SAR ADC, AROUTE, AREF, a plurality of multiplexers, and the like. The method 700 may continue with generating a first output value based on the first input signal (730). For example, the SAR ADC may provide a digital input to the logic circuit and/or FMS of the PASS. The logic circuit and/or FSM may generate the first digital output value that may be representative of the analog input to the PASS. The method 700 may continue with reconfiguring the plurality of reconfigurable analog circuits into a second PASS configuration with a second configuration setting, wherein the second configuration setting is different than the first configuration setting (740). Reconfiguring of the second PASS configuration may be performed responsive to the first output value. The PASS may maintain a correspondence between various output values and a PASS configuration to be selected responsive to a particular output value. In some implementations, the correspondence may be an index stored in one or more registers (e.g., ROM-based registers) of the PASS and/or in one or more memory devices (e.g., RAM) of the PASS. In some implementations, the correspondence may reference one or more threshold values stored by the PASS. In some implementations, a PASS configuration is to be selected if the first output value is greater than a threshold value. In some implementations, a PASS configuration is to be selected if the first output value is less than a threshold value. In some implementations, the correspondence is encoded in the circuitry of the FSM.

In some implementations, reconfiguring the plurality of reconfigurable analog circuits into a second PASS configuration may be performed by selecting one of the FSM states. In some implementations, settings for some or all of the analog circuits of the PASS may be obtained based on a selected FSM state. In some implementations, settings for some or all of the analog circuits of the PASS may be provided by the logic circuit of the PASS. In some implementations, settings for some of the analog circuits of the PASS may be provided by the FSM whereas settings for other analog circuits may be provided by the logic circuit. In some implementations, settings for some analog circuits may remain the same between two or more different PASS configurations.

Figure 8:
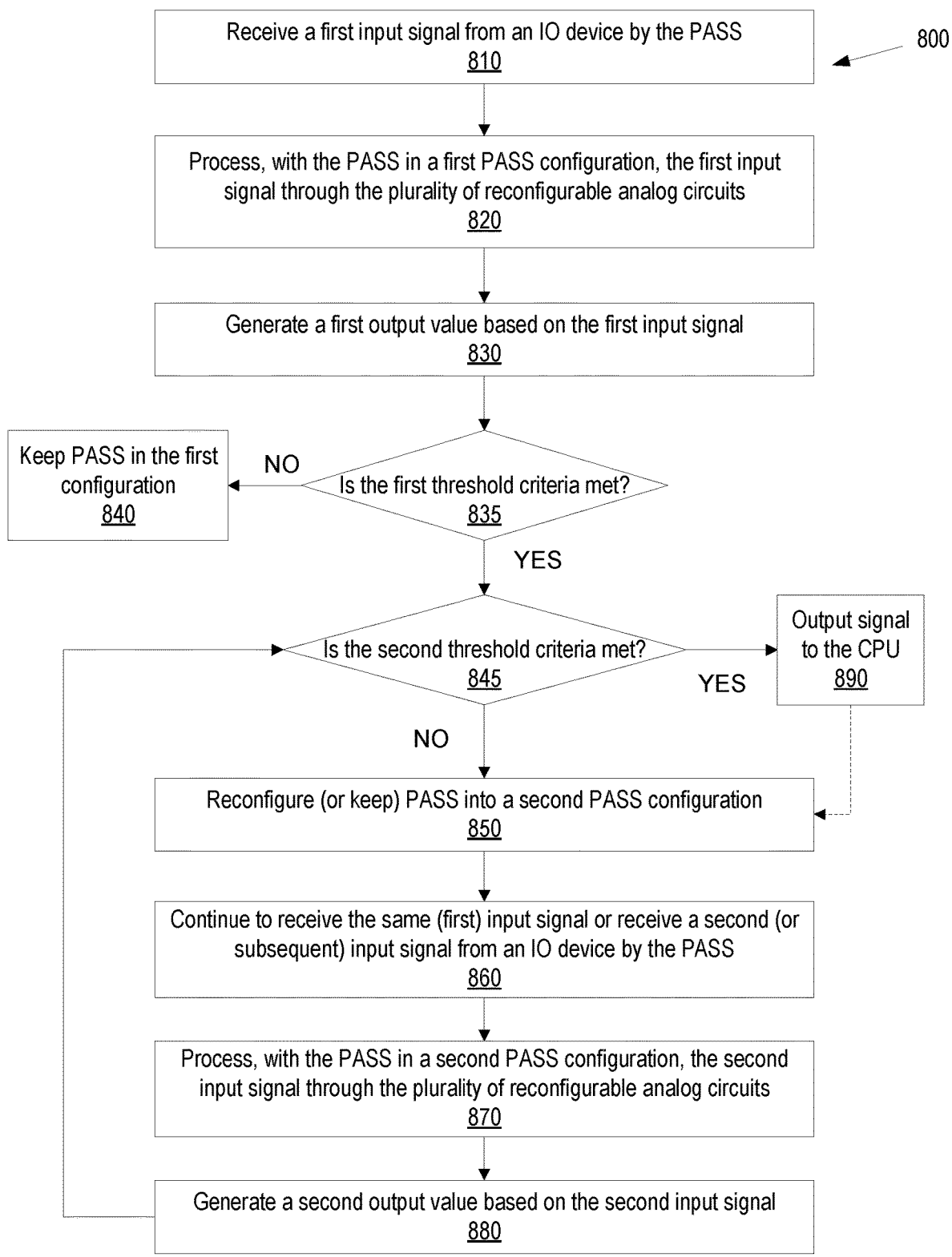
FIG. 8 is a flow diagram of one possible implementation of a method of reconfiguration, in response to an input signal, of a low-power programmable analog subsystem integrated with a digital subsystem.

FIG. 8 is a flow diagram of one possible implementation of a method 800 of reconfiguration, in response to an input signal, of a low-power programmable analog subsystem integrated with a digital subsystem. Method 800 may be performed by the same devices and circuits as described above in relation to method 700. The method 800 may include receiving a first input signal from an IO device by the PASS coupled to the IO device (810). The PASS may have a plurality of reconfigurable analog circuits and an interface to communicate data with a CPU. The method 800 may continue with processing, with the PASS in a first PASS configuration, the first input signal through the plurality of reconfigurable analog circuits (820). The method 800 may continue with generating a first output value based on the first input signal (830). The blocks 810-830 may be the same as the blocks 810-830 of the method 700, in some implementations.

The method 800 may continue with a decision-making block where it may be determined whether the first output value satisfies the first threshold criteria (835). For example, it may be determined by the logic circuit and/or the FSM whether carbon monoxide concentration has reached a detectable level. If the first threshold criteria is not met, the PASS may remain in the first PASS configuration (840). If, however, it is determined that the first threshold criteria is met, the method 800 may continue with determining whether the second threshold criteria is met (845). For example, at block 845 it may be determined whether carbon monoxide concentration has reached a dangerous level. If the second threshold criteria is not met, the method 800 may continue with reconfiguring the plurality of reconfigurable analog circuits into a second PASS configuration with a second configuration setting (850). In some implementations, block 850 may be performed similarly to block 740 of the method 700. For example, the first configuration may be used to implement the LP PASS Sleep state and the second configuration may be used to implement the LP PASS Active1 state. In other instances, the first configuration may be used to implement the LP PASS Active1 state and the second configuration may be used to implement the LP PASS Active2 state. The method 800 may continue with the LP PASS receiving a subsequent (e.g., second) input signal from an IO device. In some implementations, the second input signal may be the same as the first input signal but stored by one or more analog circuits for later re-processing by the PASS in the second configuration (which may have a higher resolution and/or accuracy of processing).

The method 800 may continue with processing, with the PASS in the second PASS configuration, the second input signal through the plurality of reconfigurable analog circuits (870) and with generating a second output value based on the second input signal (880). The actions in the blocks 870-880 may be performed similarly to the actions in the blocks 810-830. The method may then loop back to the decision-making block 845 and compare the second output with the second threshold criteria again. In the case the second threshold criteria has not been met, the method may continue with keeping the PASS in the second configuration and repeating blocks 850-880 and 845, as needed. In case the second threshold criteria has been met, the method 800 may proceed with outputting a signal to the CPU (890) (such as a wake-up or interrupt instruction, in some implementations) through an interface (such as a digital interface 455). If it is determined that both the first criteria (block 835) and the second criteria (block 845) are satisfied while the PASS is still in the first PASS configuration, the method 800 may continue with waking up the CPU (890) and also (as shown by the dashed line) reconfiguring the PASS into the second PASS configuration. In some implementations this action may be optional and the method 800 may conclude when the CPU takes over the input signal processing.

It should be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The implementations of methods, hardware, software, firmware or code set forth above may be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one implementation" or "an implementation" means that a particular feature, structure, or characteristic described in connection with the implementation is included in at least one implementation of the disclosure. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation, implementation, and/or other exemplarily language does not necessarily refer to the same implementation or the same example, but may refer to different and distinct implementations, as well as potentially the same implementation.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same imple-

What is claimed is:

1. An integrated circuit (IC) comprising:
a logic circuit;
a plurality of reconfigurable analog circuits; and
a first interface to receive a first input signal, and
wherein the IC is configured to:
in a first IC configuration, process the first input signal through the plurality of reconfigurable analog circuits to generate a first output value based on the first input signal, the plurality of reconfigurable analog circuits having a first configuration setting in the first IC configuration; and
change, responsive to the logic circuit determining that the first output value is within a range between a first threshold condition for reconfiguring the IC and a second threshold condition for waking-up a central processing unit (CPU), one or more of the plurality of reconfigurable analog circuits into a second IC configuration with a second configuration setting.

2. The IC of claim 1, wherein the plurality of reconfigurable analog circuits have a higher operating power in the second IC configuration than in the first IC configuration.

3. The IC of claim 1, wherein the IC further comprises:
a second interface to communicate with the CPU, and
wherein the IC is further configured to:
in the second IC configuration, process a second input signal through the plurality of reconfigurable analog circuits to generate a second output value, the plurality of reconfigurable analog circuits having the second configuration setting in the second IC configuration; and
responsive to the second output value satisfying the second threshold condition for waking-up the CPU, output, through the second interface, a wake-up signal to the CPU.

4. The IC of claim 3, wherein the IC is further configured to:
responsive to outputting the wake-up signal to the CPU, receive, from the CPU, configuration data comprising a third configuration setting; and
reconfigure the plurality of reconfigurable analog circuits into a third IC configuration with the third configuration setting.

5. The IC of claim 1, wherein the IC further comprises:
a second interface to communicate with the CPU, and
wherein the IC is further configured to:
in the second IC configuration, process a second input signal through the plurality of reconfigurable analog circuits to generate a second output value, the plurality of reconfigurable analog circuits having the second configuration setting in the second IC configuration; and
responsive to the second output value, output, through the second interface, a mode selection signal to the CPU.

6. The IC of claim 1, wherein the IC further comprises a first set of one or more registers to store the first configuration setting and a second set of one or more registers to store the second configuration setting.

7. The IC of claim 1, wherein the IC comprises a set of one or more registers to store the first configuration setting, and wherein to change the plurality of reconfigurable analog circuits into the second configuration, the IC is to:
modify contents of the set of one or more registers to store the second configuration setting; and
reconfigure at least one of the reconfigurable analog circuits according to the modified contents of the set of registers.

8. The IC of claim 1, wherein to change the one or more of the plurality of reconfigurable analog circuits into the second IC configuration, the logic circuit is to cause a reconfiguration of at least two of:
a continuous time block (CTB) that executes signal processing in a continuous time domain;
a discrete time block (DTB) that executes signal processing in a discrete time domain;
an analog-to-digital converter (ADC) circuit that process an output of at least one of the CTB or the DTB; or
one or more multiplexers that selectively connect the first interface to a plurality of inputs of at least of one of the CTB, the DTB, or the ADC circuit; or
an analog reference block that generates at least one of a voltage reference, a current reference, or a clock signal.

9. A system comprising:
an input/output (IO) device to receive a first input signal from a signal source;
a digital subsystem comprising a memory and a central processing unit (CPU) coupled to the memory;
an integrated circuit (IC) coupled to the IO device and to the digital subsystem, wherein the IC comprises:
a logic circuit, and
a plurality of reconfigurable analog circuits comprising, and
wherein the IC is configured to:
in a first IC configuration, process the first input signal through the plurality of reconfigurable analog circuits to generate a first output value based on the first input signal, the plurality of reconfigurable analog circuits having a first configuration setting in the first IC configuration; and
change, responsive to the logic circuit determining that the first output value is within a range between a first threshold condition for reconfiguring the IC and a second threshold condition for waking-up the CPU, one or more of the plurality of reconfigurable analog circuits into a second IC configuration with a second configuration setting.

10. The system of claim 9, wherein the plurality of reconfigurable analog circuits have a higher operating power in the second IC configuration than in the first IC configuration.

11. The system of claim 9, wherein the IC is further configured to:
in the second IC configuration, process a second input signal through the plurality of reconfigurable analog circuits to generate a second output value, the plurality of reconfigurable analog circuits having the second configuration setting in the second IC configuration; and
responsive to the second output value satisfying the second threshold condition for waking-up the CPU, output a mode selection signal to the digital subsystem.

12. The system of claim 11, wherein the IC is further configured to:
responsive to outputting the mode selection signal to the digital subsystem, receive, from the digital subsystem, configuration data comprising a third configuration setting, wherein the third configuration setting is different than the second configuration setting; and reconfigure the plurality of reconfigurable analog circuits into a third IC configuration with the third configuration setting.

13. The system of claim 9, wherein the IC comprises a first set of registers to store the first configuration setting and a second set of registers to store the second configuration setting.

14. The system of claim 9, wherein the IC comprises a set of registers to store the first configuration setting, and wherein to reconfigure the plurality of reconfigurable analog circuits into the second configuration is to:

modify contents of the set of registers to store the second configuration setting; and reconfigure at least one of the reconfigurable analog circuits according to the modified contents of the set of registers.

15. A method comprising:

receiving a first input signal by an integrated circuit (IC) via a first interface, the IC comprising a plurality of reconfigurable analog circuits and a logic circuit;

processing, with the IC in a first IC configuration, the first input signal through the plurality of reconfigurable analog circuits, wherein the plurality of reconfigurable analog circuits have a first configuration setting in the first IC configuration;

generating a first output value based on the first input signal; and changing, responsive to the logic circuit determining that the first output value is between a first threshold condition for reconfiguring the IC and a second threshold condition for waking-up a central processing unit (CPU), one or more of the plurality of reconfigurable analog circuits into a second IC configuration with a second configuration setting.

16. The method of claim 15, wherein the plurality of reconfigurable analog circuits have a higher operating power in the second IC configuration than in the first IC configuration.

17. The method of claim 15, further comprising:

processing, with the IC in the second IC configuration, a second input signal through the plurality of reconfigurable analog circuits, wherein the plurality of reconfigurable analog circuits have the second configuration setting in the second IC configuration;

generating a second output value; and responsive to the second output value, outputting, through the interface, a signal to a CPU communicatively coupled to the IC.

18. The method of claim 17, wherein outputting the signal to the CPU is responsive to determining that the second output value meets the second threshold condition.

19. The method of claim 15, wherein changing the one or more of the plurality of reconfigurable analog circuits into the second IC configuration, comprises the logic circuit causing a reconfiguration of at least two of:

a continuous time block (CTB) that executes signal processing in a continuous time domain;

a discrete time block (DTB) that executes signal processing in a discrete time domain;

an analog-to-digital converter (ADC) circuit that process an output of at least one of the CTB or the DTB; or one or more multiplexers that selectively connect the interface to a plurality of inputs of at least one of the CTB, the DTB, or the ADC circuit; or an analog reference block that generates at least one of a voltage reference, a current reference, or a clock signal.

* * * * *